United States Patent [19]
Endo

[11] Patent Number: 5,780,121
[45] Date of Patent: Jul. 14, 1998

[54] METHOD FOR PREPARING A FLUORO-CONTAINING POLYIMIDE FILM

[75] Inventor: Kazuhiko Endo, Tokyo, Japan

[73] Assignee: NEC Corporation, Tokyo, Japan

[21] Appl. No.: 873,592

[22] Filed: Jun. 12, 1997

Related U.S. Application Data

[62] Division of Ser. No. 487,243, Jun. 13, 1995, Pat. No. 5,702,773.

[30] Foreign Application Priority Data

Jun. 13, 1994 [JP] Japan .................. 6-129983
Aug. 30, 1994 [JP] Japan .................. 6-204085

[51] Int. Cl.$^6$ ........................................ H05H 1/24
[52] U.S. Cl. ............... 427/569; 427/248.1; 427/294; 427/295; 427/388.1; 427/346; 437/231; 437/245
[58] Field of Search ................ 427/573, 294, 427/295, 248.1, 569, 388.1, 346; 437/231, 245

[56] References Cited

FOREIGN PATENT DOCUMENTS 57-6107  2/1982  Japan .
6-9803   1/1994  Japan .

OTHER PUBLICATIONS

Y. Misawa et al., "A New Multilevel Interconnection System for Submicrometer VLSI's Using Multilayered Dielectrics of Plasma Silicon Oxide and Low–Thermal–Expansion Polyimide", IEEE Transactions on Electron Devices, Mar. 1987, vol. ED–34, No. 3, pp. 621–627.

S–Y. Wu, "Dielectric and Chemical Modifications in Polyimide Films Etched in $O_2/CF_4$ Plasmas", J. Vac. Sci. Technol., Jul./Aug. 1993, vol. 11, No. 4, pp. 1337–1345.

E. Onyiriuka, "Effects of $O_2$, Air, and $CF_4$ Plasmas on Poly(etherketon) Surfaces", J. Vac. Sci. Technol., Nov./Dec. 1993, Vo. 11, No. 6, pp. 2941–2944.

"Fluoro–Containing Polyimide Blends: Prediction and Experiments", Journal of Polymer Science: Part A: Polymer Chemistry, 1991, vol. 29, pp. 1207–1212. (no month avail.).

*Primary Examiner*—Bernard Pianalto
*Attorney, Agent, or Firm*—Young & Thompson

[57] ABSTRACT

A method for blending fluorine into a polyimide free of fluorine comprises the steps of generating fluorine radicals in a fluorine based gas, removing charge particles from the gas to leave the fluorine radicals in the gas, and exposing a polyimide free of fluorine to an irradiation of the fluorine radicals so that the irradiated fluorine radicals penetrate into the polyimide, thereby avoiding reaction of the charge particles with a surface of the polyimide.

13 Claims, 5 Drawing Sheets

METHOD FOR PREPARING A FLUORO-CONTAINING POLYIMIDE FILM

This application is a division of application Ser. No. 08/487,243, filed Jun. 13, 1995, U.S. Pat. No. 5,702,773.

BACKGROUND OF THE INVENTION

The invention relates to a method for preparing a fluoro-containing polyimide film.

Fluoro-containing polyimides or polyimides containing fluorine have now been receiving a great deal of attention for use in semiconductor devices as dielectric films, inter-layer insulators, or passivation films and in place of other industrially applicable compounds due to its excellent properties such as a high thermal stability and a low dielectric constant.

The dielectric films or the insulators are required to have a possible low dielectric constant when used in the multi-level interconnection systems in order to reduce a signal delay. A large dielectric constant provides a large parasitic capacitance which causes a signal delay, resulting in difficulty in allowing integrated circuits to show the required high speed performance. Dielectric constants of $SiO_2$ and $Si_3N_4$ are about 4 and 7 respectively, which are too high to apply those to the dielectric films involved in the semiconductor integrated circuits or any other semiconductor devices having high integrations and showing high frequency and speed performances.

Although the polyimides have a dielectric constant of 3 which is lower than those of silicon dioxide and silicon nitride, an insulator or dielectric material is required to further reduce the dielectric constant and to increase thermal stability so as to be suitable for use in the integrated circuits or semiconductor devices facing the issues of considerable scaling down and realization of a high speed performance. Reductions in a width of the interconnection and in a distance of adjacent interconnections results in undesirable increases in a parasitic capacitance of the interconnections and also in a parasitic resistance thereof. The reductions in the parasitic capacitance of the interconnections and also in the parasitic resistance thereof need a reduction in the dielectric constant of the inter-layer insulator. The interconnection delay or the circuit delay is associated with the parasitic capacitance of the interconnections and the parasitic resistance thereof. It has been generally known that the interconnection delay is proportional to the square root of the dielectric constant of the inter-layer insulator between the interconnections. From the above descriptions, it could be understood that a possible low dielectric constant of the inter-layer insulator between the interconnections is required to reduce the interconnection delay or the circuit delay.

Polyimides including fluorine have a higher thermal stability and a lower dielectric constant than those of the polyimide free of fluorine. For that reason, fluoro-containing polyimides or polyimides containing fluorine have now been receiving a great deal of attention.

Such fluoro-containing polyimides are, however, engaged with serious problems in production thereof, for example, a low yield and an extremely high cost. The following description will then focus on the conventional production method for the fluoro-containing polyimides.

According to the conventional production method, the fluoro-containing polyimide is prepared by a thermal polymerization of polyimide monomers already containing fluorine, for example, a thermal polymerization of fluoro-tetracarbonic acid or fluoro-diamine. Namely, the fluoro-containing polyimide has to be prepared via the polymerization of the fluoro-containing polyimide monomers. The above problem would be in the fact that the yield of the polymerization of the fluoro-containing polyimide monomers be considerably low. The polymerization reactivity of the fluoro-containing polyimide monomers would be low. A small moleculare weight of polyimide main-chain makes it difficult to control the fluorine contents in the polyimide. This results in a considerable increase of the production cost for the fluoro-containing polyimides, further leading to an increase of the manufacturing cost for the semiconductor integrated circuits or the semiconductor devices.

To settle the above problems, a treatment for rendering the polyimides containing fluorine has to be carried out after the polymerization of the fluoro-free polyimide monomers. There has been proposed a method for blending fluorine into polymers by irradiation of AC or DC plasma of fluorine-based gases onto the polymer. This method is disclosed in the Japanese Patent Publication No. 57-6107 and 6-9803. This method has, however, the problem with the fact that the fluorine irradiated on the polymer by the plasma gas irradiation reside only in a surface region of the polymer but neither penetrate nor diffuse into a deep region of the polymer. As a result, the surface region of the treated polymer is merely changed in its property. Notwithstanding, it is required to blend fluorine not only in a surface region of the polyimide but also a deep region thereof.

It is therefore, required to develop a quite novel method for blending the fluorine into whole parts of the polyimide that have already been prepared by polymerization of the fluoro-free polyimide monomers with a controlled fluoro-concentration profile in a depth direction of the polyimide.

SUMMARY OF THE INVENTION

Accordingly, it is an object of the present invention to provide a novel method of preparing a fluoro-containing polyimide free from any problems as described above.

It is a further object of the present invention to provide a novel method of preparing a fluoro-containing polyimide at a high yield.

It is a furthermore object of the present invention to provide a novel method of preparing a fluoro-containing polyimide at a low cost.

It is a still further object of the present invention to provide a novel method for blending fluorine into a whole part of a polyimide that has already been prepared by polymerization of fluoro-free polyimide monomers with a controlled fluoro-concentration profile in a depth direction of the polyimide.

It is another object of the present invention to provide a novel method for forming a fluoro-containing polyimide on a semiconductor base layer with a high adhesiveness between those.

It is still another object of the present invention to provide a novel method of forming a fluoro-containing polyimide on a semiconductor base layer at a high yield.

It is yet another object of the present invention to provide a novel method of forming a fluoro-containing polyimide on a semiconductor base layer at a low cost.

It is a moreover object of the present invention to provide a novel method for forming on a semiconductor base layer a fluoro-containing polyimide with a suitable fluoro-concentration profile in a depth direction for improvement in adhesiveness of the polyimide to the semiconductor base layer.

It is an additional object of the present invention to provide a novel system for exposing a polyimide film on a semiconductor base layer to an irradiation of fluoro-containing gas plasma for blending fluorine into the polyimide film.

The above and other objects, features and advantages of the present invention will be apparent from the following descriptions.

The invention provides a novel method for blending fluorine into a polyimide free of fluorine comprising the following steps. Fluorine radicals are generated in a fluorine based gas. Any charge particles are removed from the gas to leave the fluorine radicals in the gas. A polyimide free of fluorine is exposed to an irradiation of the fluorine radicals so that the irradiated fluorine radicals penetrate into an inside of the polyimide, thereby avoiding reaction of charge particles with a surface of the polyimide.

The polyimide has at least a temperature being sufficiently high for facilitating a thermal diffusion of the fluorine radicals into a deep region of the polyimide. The fluorine radicals may be generated in a plasma gas by a glow discharge of the fluorine based gas in a vacuum. Alternatively, the fluorine radicals may be generated by a dissociation of the fluorine based gas where the dissociation is caused by irradiation of the fluorine based gas onto a tungsten heater in vacuum. The removal of any charge particles from the gas is carried out by having the gas including the charge particles, the fluorine radicals and the neutral particles pass through a control grid applied with a predetermined voltage.

The present invention also provides a method for forming a polyimide film containing fluorine on a base layer comprising the following steps. A polyimide film free of fluorine is formed on a base layer. Fluorine radicals are generated in a fluorine based gas. Removal of any charge particles from the gas is carried out to leave the fluorine radicals in the gas. The polyimide film is exposed to an irradiation of the fluorine radicals so that the irradiated fluorine radicals penetrate into the the polyimide, thereby avoiding reaction of charge particles with a surface of the polyimide film. A temperature of the polyimide film and a time for the irradiation are so controlled that a fluorine concentration of the polyimide film comes into zero or almost zero on an interface of the polyimide film to the base layer. The temperature is sufficiently high for facilitating a thermal diffusion of the fluorine radicals into a deep region of the polyimide. The polyimide free of fluorine is prepared by the steps of applying a polyamide acid on the base layer by a spin coating method and subjecting the applied polyamide acid to a heat treatment to cause a thermal polymerization to thereby form a polyimide film free of fluorine. The base layer may be a metal layer, an insulation layer, or a semiconductor layer.

The present invention also provide a polyimide film containing fluorine formed on a base layer. The polyimide film has such a fluorine concentration profile that a fluorine concentration approaches into zero or almost zero on an interface of the polyimide film to the base layer.

BRIEF DESCRIPTION OF THE DRAWINGS

Preferred embodiments of the present invention will hereinafter fully be described in detail with reference to the accompanying drawings.

DISCLOSURE OF THE INVENTIONS

According to the present invention, a fluorine radical is generated by use of a radical generator from a fluorine based gas such as $CF_4$, $F_6$, $CF_4$, $NF_3$ or $C_2F_6$. A polyimide film free of fluorine is prepared by polymerization of polyimide monomers free of fluorine. The fluoro-free polyimide film is exposed to a selective irradiation of fluorine radicals in plasma states free of any charge particles so as to prevent the irradiated fluorine radicals from showing an undesirable reaction with the charge particle on a surface of the polyimide film. During the plasma irradiation, the polyimide film is further kept heated up to a sufficient temperature for causing the unreacted fluorine radicals to show a thermal diffusion into a deeper region of the polyimide film to thereby obtain a fluoro-containing polyimide film.

It is important for the present invention to remove charge particles from the plasma gas for the purpose of preventing the irradiated fluorine radicals from reacting with the charge particles on the surface of the fluoro-free polyimide. The charge particles may include fluorine ions, $CF_x$ ions (x=1–4) and other charge particles. If the charge particles reach the surface of the polyimide, the fluorine radicals are likely to react with the charge particles to thereby reside only within the surface region of the polyimide and never be diffused into a deep region of the polyimide.

The fluorine radicals show no reaction to neutral particles. Then, even if the neutral particles reach the surface of the polyimide film, the neutral particles never serve as a bar to the intended thermal diffusion of the fluorine radicals into the polyimide film.

Figure 1:
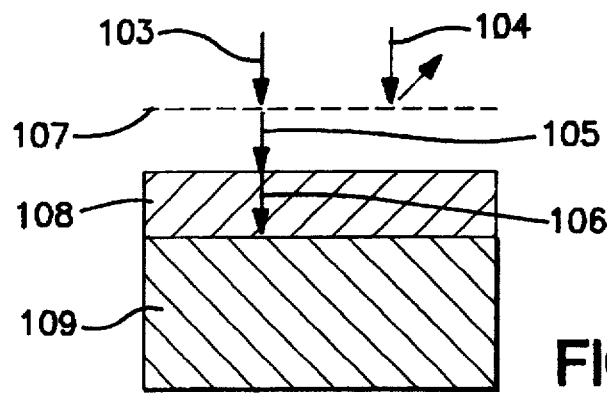
FIG. 1 is a view illustrative of a novel method for blending fluorine into a polyimide film formed on a silicon substrate according to the present invention.

In practice, the required removal of the issued charge particles from the plasma gas may be achieved by use of a control grid through which the plasma gas containing the fluorine radicals is irradiated onto the polyimide film as illustrated in FIG. 1. Namely, a polyimide film 108 free of any fluorine is formed on a silicon substrate 109. There is generated a plasma gas containing not only the fluorine radicals 103 such as F* and $CF_x$* but also neutral particles other than the fluorine radicals and further the variety of undesirable charge particles 104 such as fluorine ions and $CF_x$ ions (x=1–4). The plasma gas is irradiated through the control grid 107 onto the surface of the polyimide film 108 on the silicon substrate 109. The control grid 107 allows the fluorine radicals 103 and the neutral particles to pass therethrough and reach onto the surface of the polyimide film 108, but prevents the charge particles 104 from passing therethrough. As a result, the fluorine radicals 103 and the neutral particles only are irradiated onto the surface of the polyimide film 108. Since no charge particles reside on the surface of the polyimide film 108, the irradiated fluorine radicals show no reaction with the charge particle. In the meantime, the silicon substrate 109 is kept to be heated up to a predetermined temperature for causing the thermal diffusion of the unreacted fluorine radicals into the inside of the polyimide film 108 to thereby obtain a fluoro-containing polyimide film.

The conventional method described earlier is, however, contrasted with the present invention. According to the conventional method, no removal of the issued charge particles from the plasma gas is carried out, for which reason the irradiated fluorine radicals shows the undesirable reaction with the charge particles on the surface of the fluoro-free polyimide. As a result, there appears no thermal diffusion of the fluorine radicals into the inside of the polyimide film. Hence, the fluorine is blended only within the surface region of the polyimide film.

Figure 2:
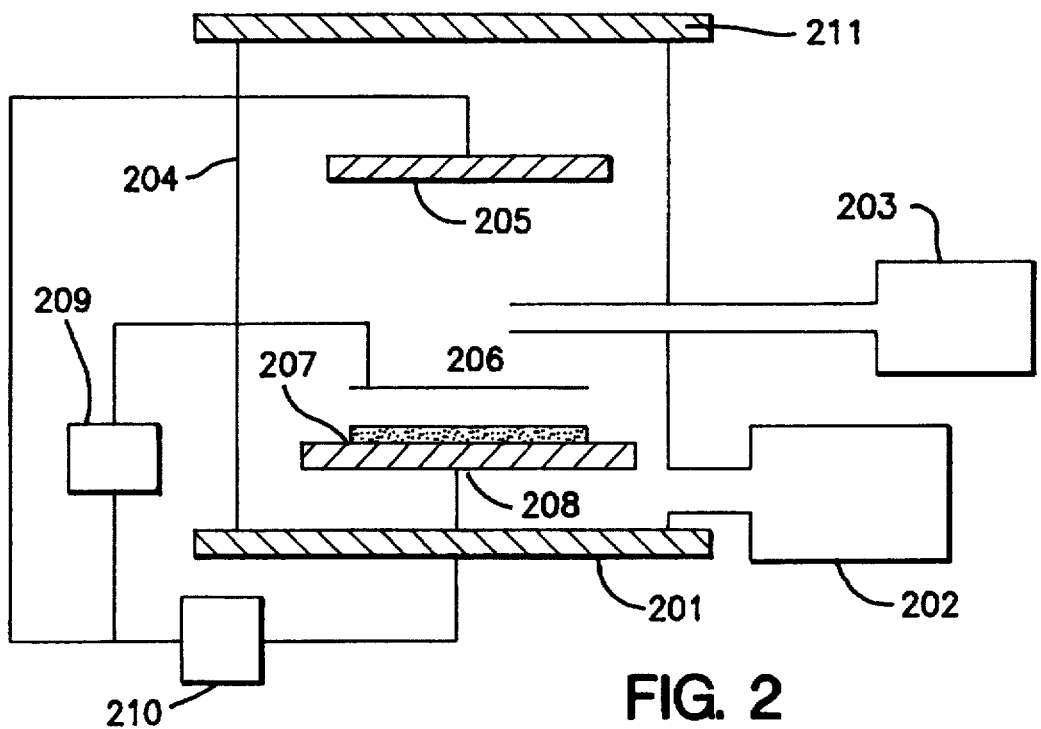
FIG. 2 is a diagram illustrative of a system for exposing a polyimide film formed on a silicon substrate to an irradiation of a fluoro-containing gas plasma for blending fluorine into the polyimide film according to the present invention.

The description will hereinafter focus on a preferred embodiment according to the present invention. FIG. 2 is illustrative of an available system for blending fluorine radicals into the polyimide film. A vacuum chamber 204 is placed on a supporting plate 201. The vacuum chamber is coupled to a vacuum pump 202. The vacuum chamber is also provided with a top cap 211. Top and bottom electrodes 205 and 208 are provided within the vacuum chamber 204 spaced apart from one another. A high power supply 210 is provided at the outside of the vacuum chamber 204 to be electrically connected to both the top and bottom electrodes 205 and 208 so that AC or DC power is applied across the top and bottom electrodes 205 and 208. A gas tank 203 within which fluorine based source gases are reserved is provided at the outside of the vacuum chamber 204. The gas tank 203 is provided with a slender gas injection nozzle penetrating into the inside of the vacuum chamber 204 so that an injection port of the gas injection nozzle is positioned between the top and bottom electrodes 205 and 208. A sample 207 of the fluoro-free polyimide film formed on the silicon substrate is placed on the bottom electrode 208. A control grid 206 is placed between the top and bottom electrodes 205 and 208, provided that the placement position of the control grid is under the gas injection port of the gas injection nozzle, but over the sample 206. A DC power supply 209 is provided at the outside of the vacuum chamber 204 to be electrically connected to both the control grid 206 and the bottom electrode 208 to apply a DC power across the control grid 206 and the bottom electrode 208. The bottom electrode 208 is provided with a heater designed for heating the sample 207 up to a predetermined temperature.

Operation of the above described system will be described. The inside of the vacuum chamber 204 is vacuumed by the vacuum pump 202 to a vacuum pressure in the range of from 0.01 to 0.5 Torr. Into the vacuum chamber 204, a fluorine based source gas such as $CF_4$, $SF_6$, $C_2F_4$, $NF_3$ and $C_2F_8$ is introduced through the injection nozzle from the gas tank 203. DC or AC power is applied across the top and bottom electrodes 205 and 208 to cause a glow discharge of the injected fluorine based gas between the top and bottom electrodes 205 and 208. The plasma gas includes the fluorine radicals, charge particles and neutral particles. Further, a DC power is applied across the control grid 206 and the bottom chamber 208 so as to allow only the fluorine radicals and the neutral particles to pass through the control grid 206 but prevent the charge particles from passing through the control grid 206. As a result, the fluorine radicals and the neutral particles only are irradiated onto the surface of the polyimide film so that reaction of the charge particles with the surface of the polyimide film is avoided. Moreover, the sample 207 is heated up to a predetermined temperature by the heater provided in the bottom electrode 208 to thereby cause a thermal diffusion of the fluorine radicals into the inside of the polyimide film.

In order to evaluate the effects of the removal of the charge particles according to the present invention but free of any effect of the thermal diffusion of the fluorine radical, the following experiments were carried out. A silicon substrate is subjected to a spin coating of polyamide acid for subsequent annealing at 350° C. to cause a polymerization thereof, resulting in a deposition of a 0.1 micrometers polyimide film on the silicon substrate. $CF_4$ gas is introduced into the inside of the vacuum chamber 204 which is set at a pressure of 0.5 Torr. The top and bottom electrodes are applied with AC power of 5 W and the control grid 206 is applied with a positive voltage of 300 V. The sample 207 is set at a room temperature to separate the effect of the removal of the charge particles from any effect of the thermal diffusion of the fluorine radicals. Under the above conditions, the polyimide film is exposed to the irradiation of the fluorine based gas plasma including fluorine radicals and neutral particles only free of any charge particles for the purpose of having the polyimide contain fluorine by exposing the polyimide to an irradiation of a fluoro-containing gas plasma according to the present invention.

Figure 3:
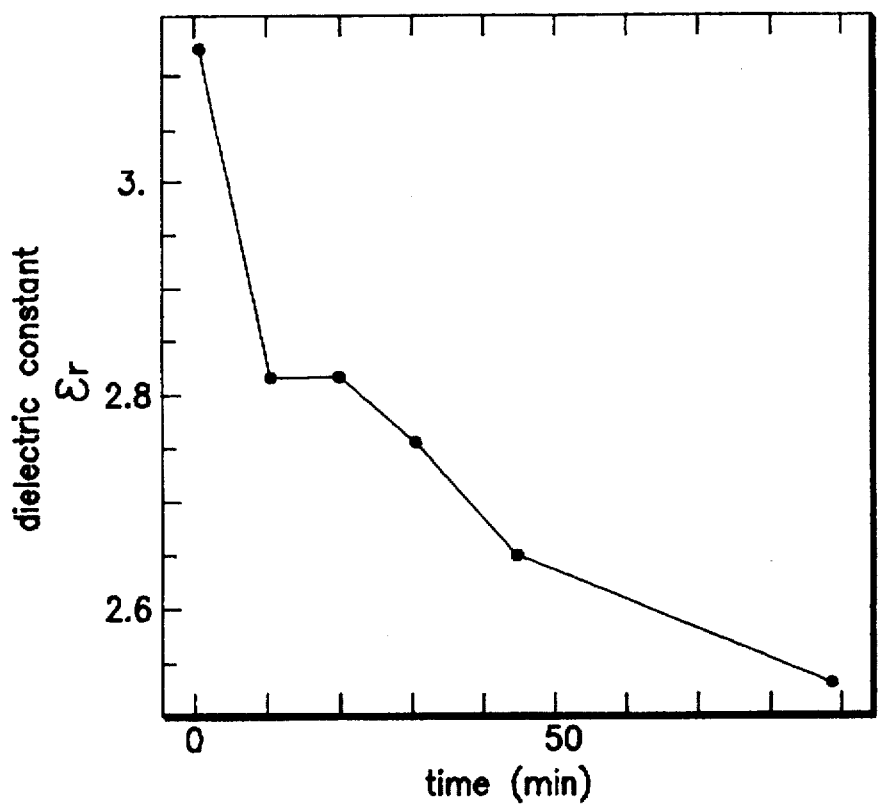
FIG. 3 is a diagram illustrative of a relationship of a dielectric constant of a fluoro-treated polyimide versus a time of treatment for having the polyimide contain fluorine by exposing the polyimide to an irradiation of a fluoro-containing gas plasma according to the present invention.

FIG. 3 is illustrative of a relationship of a dielectric constant of the above fluoro-treated polyimide versus a time of treatment. FIG. 3 indicates the fact that the dielectric constant of the polyimide film is reduced as time passes. There was confirmed the fact that the dielectric constant of the polyimide film is reduced as the fluorine concentration of the polyimide film is increased. In considerations of those matters, it is understood that the blending of the fluorine into the inside of the polyimide film is well progressed.

Figure 4B:
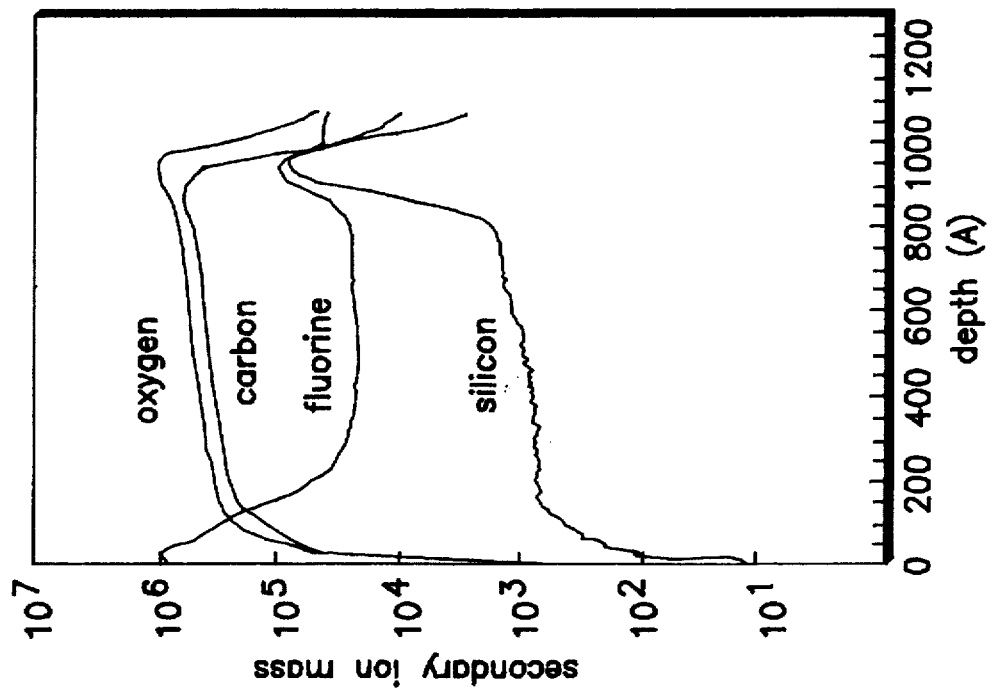
FIG. 4B is a diagram illustrative of detected values of a secondary ion mass spectrometry with respect to concentration profiles of oxygen, carbon, fluorine and silicon in a fluoro-treated polyimide versus a depth thereof wherein the detections were carried out after the treatment for having the polyimide contain fluorine by exposing the polyimide to an irradiation of a fluoro-containing gas plasma according to the present invention.
Figure 4A:
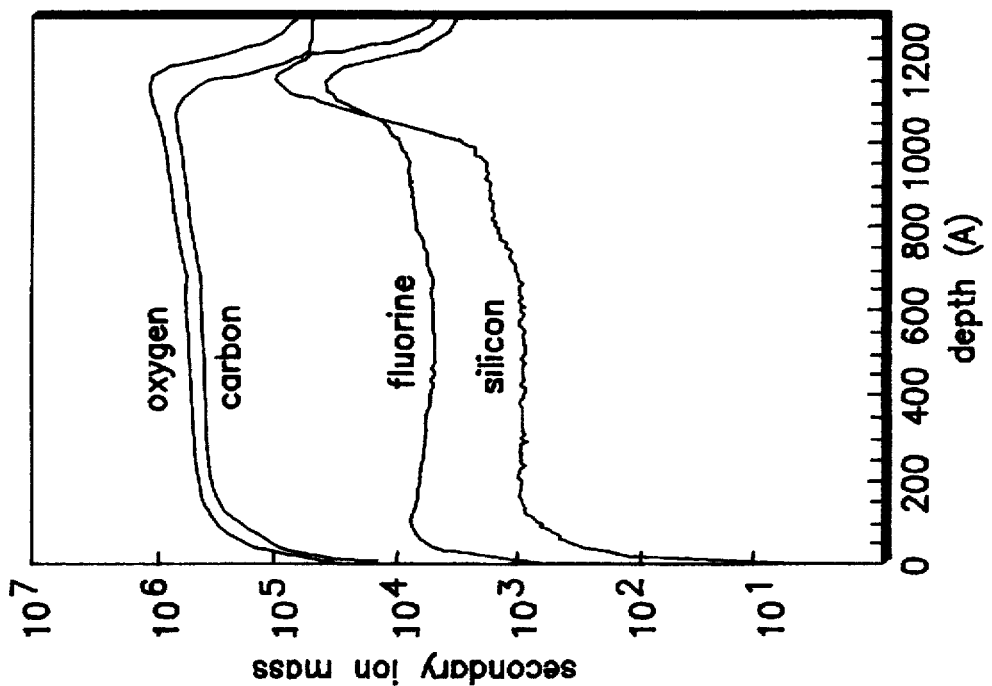
FIG. 4A is a diagram illustrative of detected values of a secondary ion mass spectrometry with respect to concentration profiles of oxygen, carbon, fluorine and silicon in an untreated polyimide versus a depth thereof wherein the detections were carried out before the treatment for having the polyimide contain fluorine by exposing the polyimide to an irradiation of a fluoro-containing gas plasma according to the present invention.

FIG. 4A is illustrative of detected values of a secondary ion mass spectrometry with respect to concentration profiles of oxygen, carbon, fluorine and silicon in an untreated polyimide versus a depth thereof wherein the detections were carried out before the treatment for having the polyimide contain fluorine by exposing the polyimide to the irradiation of the fluoro-containing gas plasma-free of any charge particles.

FIG. 4B is illustrative of detected values of the secondary ion mass spectrometry with respect to concentration profiles of the above individual elements in a fluoro-treated polyimide wherein the detections were carried out after the treatment for having the polyimide contain fluorine by exposing the polyimide to the irradiation of the fluoro-containing gas plasma free of any charge particles.

The detected values are relative values but not absolute values. Then, although the fluorine level lies in the vicinity of $1 \times 10^4$ in FIG. 4A, in fact the polyimide contains no or almost no fluorine component. Evaluations must be made only on a variation or a difference of the detected values. In FIG. 4B, the detected values with respect to the fluorine component are considerably increased from that of FIG. 4A. This means the fact that an appreciable amount of the fluorine is well blended into the polyimide. Such increase appears over a range in the order of 1000 angstroms. This means the fact that the fluorine is blended in a wide area of the polyimide so as to reside at a depth of approximately 1000 angstroms from the surface thereof.

Figure 5:
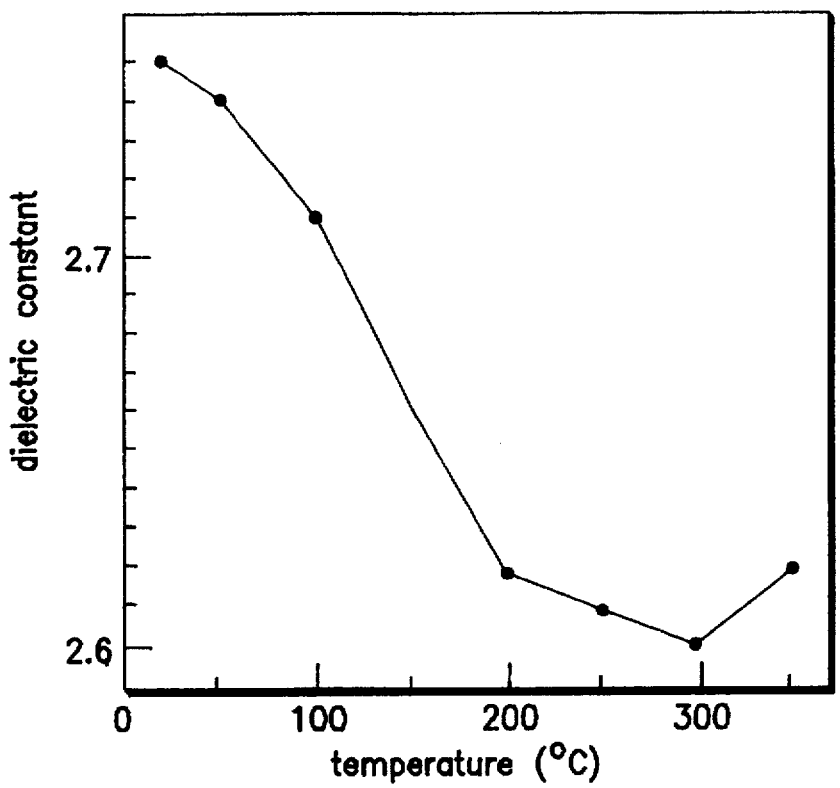
FIG. 5 is a diagram illustrative of a relationship of a dielectric constant of a fluoro-treated polyimide versus a temperature of a semiconductor substrate formed with the polyimide thereon.

FIG. 5 is illustrative of a relationship of a dielectric constant of the fluoro-treated polyimide versus a temperature wherein the temperature is varied from the room temperature to evaluate the effect on the variation of the temperature of the sample. FIG. 5 indicates the fact that the dielectric constant of the polyimide is dropped as the temperature thereof is increased up to 300° C. The increase in the temperature of the polyimide facilitates the reaction for allowing the polyimide to contain and chemically bond with the fluorine. Notwithstanding, when the temperature is increased beyond 300° C., there comes to appear an elimination reaction of the fluorine from the polyimide. As a result, the dielectric constant of the polyimide is increased when the temperature thereof is increased beyond the above critical temperature of 300° C. It was confirmed that the range of the temperature of the polyimide from 100° C. to 300° C. is preferable.

Figure 6:
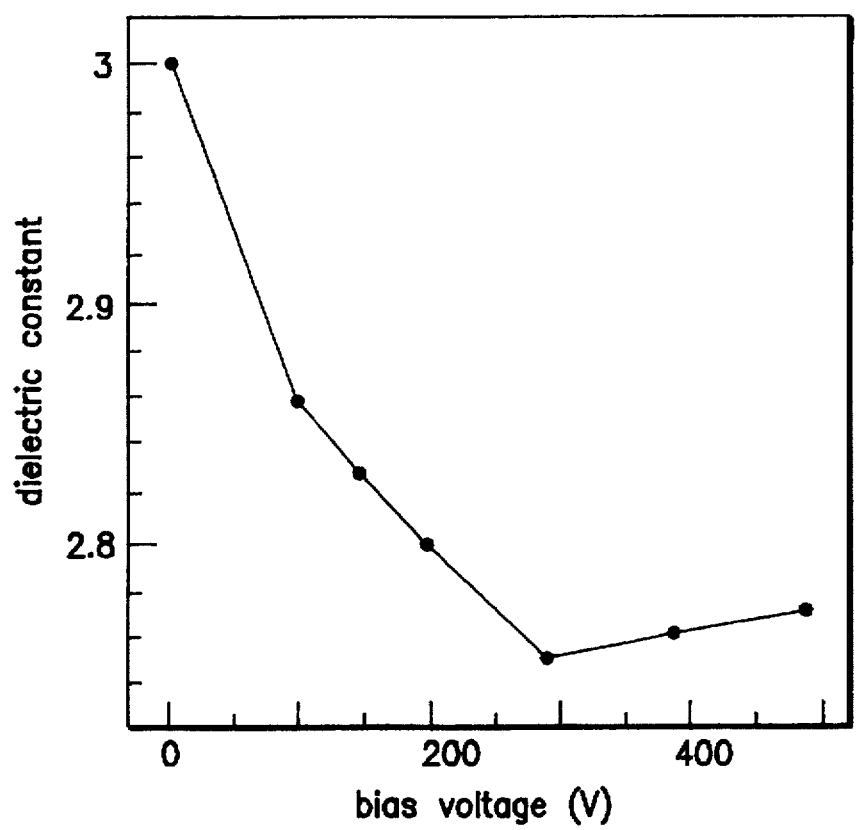
FIG. 6 is a diagram illustrative of a relationship of a dielectric constant of a fluoro-treated polyimide versus a bias voltage level applied to electrodes in a system for exposing the polyimide to an an irradiation of a fluoro-containing gas plasma for having the polyimide contain fluorine according to the present invention.

FIG. 6 is illustrative of a relationship of the dielectric constant of the fluoro-treated polyimide versus a bias voltage level applied to the control grid. The dielectric constant of the polyimide is reduced as the bias voltage applied to the control grid is increased. When the bias voltage is increased beyond 300 V, no reduction of the dielectric constant of the polyimide appears. The increase of the bias voltage applied to the control grid up to a critical voltage of 300 V may increase a probability of removal of the charge particles by the control grid. It was confirmed that the effective range of the voltage applied to the control grid is 100 V to 300 V.

Figure 7:
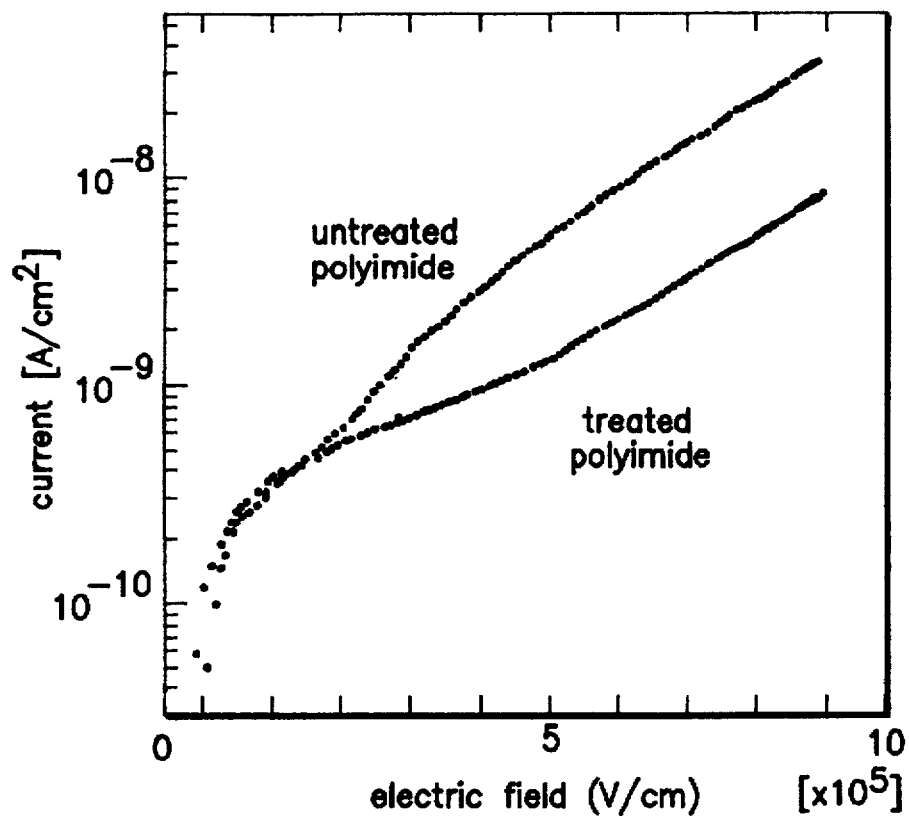
FIG. 7 is a diagram illustrative of relationships of currents flowing through fluoro-treated and untreated polyimides versus an electric filed applied to both the polyimides to evaluate resistivities thereof according to the present invention.

FIG. 7 is illustrative of relationships of currents flowing as through fluoro-treated and untreated polyimides versus an electric filed applied to both the polyimides to evaluate resistivities and conductivities thereof. FIG. 7 indicates the fact that the fluoro-containing polyimide shows a higher resistivity and a lower conductivity than those of the fluoro-free polyimide. It is considered that the conductivity of the polyimide is given by ionized impurities serving as carriers included in the polyimide. The blending of the fluorine radicals into the polyimide may reduce the number of ionized impurities serving as carriers included in the polyimide.

Further, there were confirmed the facts that the use of $F_2$, $SF_6$, $C_2F_4$, $NF_3$ and $C_2F_6$ have come into the same result as the above described result when using $CF_4$.

Furthermore, there was confirmed the fact that the same result as those described above is obtained even when in place of the plasma gas irradiation the fluorine based gases such as $CF_4$, $F_2$, $SF_6$, $C_2F_4$, $NF_3$ and $C_2F_6$ onto a tungsten heater to cause a dissociation of the fluorine based gases for the purpose of generating the fluorine radicals to be irradiated through the removal of any charge particles onto the surface of the polyimide.

The above fluoro-containing polyimide film may be formed not only on the semiconductor layer but also on metal layers serving as interconnections and insulation films. It was confirmed that the adhesiveness of the fluoro-containing polyimide film to a base layer depends upon an interface between two of the above film and layer. When in the fluoro-containing polyimide film the fluorine resides at an appreciable concentration on the interface to the base layer on which the fluoro-containing polyimide film is formed, the adhesiveness between the two layers is reduced. To prevent the reduction in adhesiveness between the two layers, it is required that no fluorine resides on the interface even the fluorine resides within the polyimide film at a sufficiently high concentration. According to the present invention, there is thus carried out a control on a fluorine concentration in a depth direction of the polyimide film so that the fluorine concentration approaches zero or almost zero on the interface, while the fluorine concentration is high in whole parts of the polyimide film except on the interface.

Figure 8:
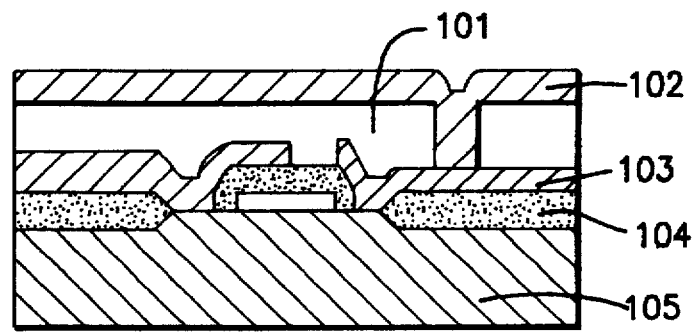
FIG. 8 is a fragmentary cross sectional elevation view illustrative of a semiconductor device involving a fluoro-containing polyimide prepared by a method of the present invention.

FIG. 8 is illustrative of a semiconductor device involving the fluoro-containing polyimide film prepared by a method of the present invention wherein the fluoro-containing polyimide film 101 is formed on a first aluminum layer 103. Field oxide films 104 of silicon dioxide are selectively formed on a surface of a silicon substrate 105. The first aluminum layer 103 is formed on the silicon substrate and on the silicon dioxide films 104. The fluoro-containing film 101 is formed on the first aluminum layer 103. A second aluminum layer 102 is formed on the fluoro-containing polyimide film 101. The fluoro-containing polyimide film 101 serves as an inter-layer insulator between the first and second aluminum layers 102 and 103 serving as interconnections. The polyimide film free of fluorine was prepared by subjecting the substrate to a spin coating of polyamide acid and subsequent heat treatment in the range of from 300° to 400° C. to cause a thermal polymerization of the polyamide. The subsequent blending of the fluorine into the fluoro-free polyimide film was carried out by use of the same system of FIG. 2 and process as described above.

$CF_4$ gas is introduced into the inside of the vacuum chamber 204 which is set at a pressure of 0.5 Torr. The top and bottom electrodes are applied with AC power of 5 W and the control grid 206 is applied with a positive voltage of 300 V. The sample 207 is set at a temperature of 100° C. Under the above conditions, the polyimide film is exposed for 30 minutes to the irradiation of the fluorine based gas plasma, including fluorine radicals and neutral particles, only free of any charge particles for the purpose of having the polyimide contain fluorine by exposing the polyimide to an irradiation of a fluoro-containing gas plasma according to the present invention.

Figure 9:
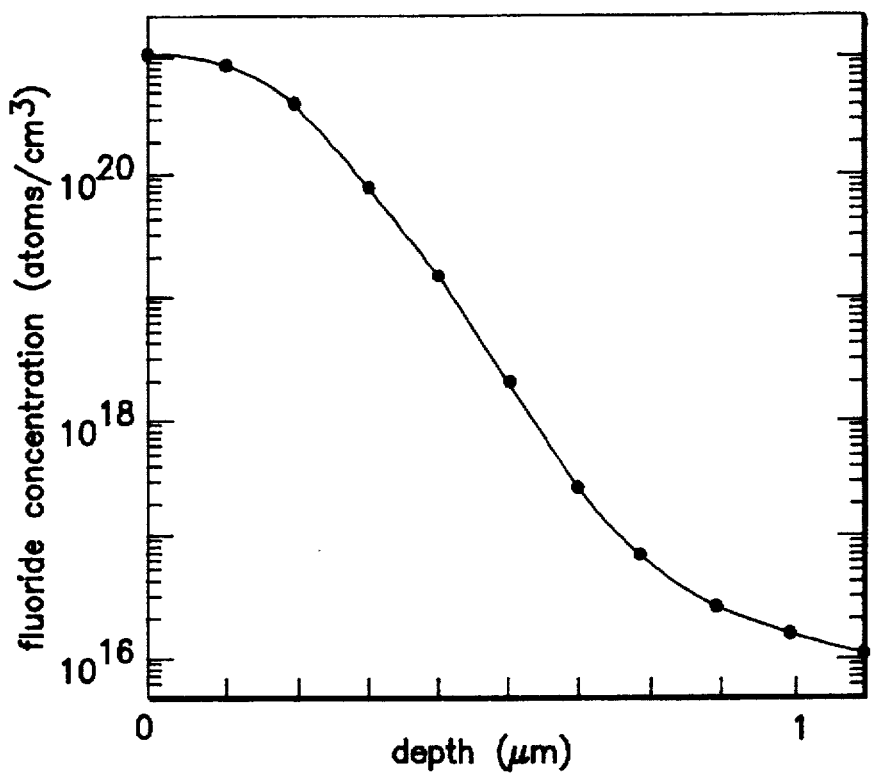
FIG. 9 is a diagram illustrative of fluoro-concentration profiles of fluoro-containing polyimide in a depth direction thereof after a treatment for having the polyimide contain fluorine by exposing the polyimide to an irradiation of a fluoro-containing gas plasma according to the present invention.

FIG. 9 is illustrative of fluoro-concentration profiles of the obtained fluoro-containing polyimide in a depth direction thereof. A measurement of the fluoro-concentration profiles was; carried out by use of the secondary ion mass spectrometry. By comparison to FIGS. 4A an 4B, FIG. 9 indicates the absolute values of the fluoro-concentrations. The content or concentration profile with respect to the fluorine in the fluoro-containing polyimide film 101 is gradually dropped toward the interface to the first aluminum layer 103 so that in the vicinity of the interface the fluorine concentration comes down to noise levels of the used secondary ion mass spectrometer. This means the fact that in the vicinity of the interface the fluorine concentration approaches zero to or near to zero. The fluorine concentration profile may be controlled by controlling the temperature of the sample and the time of the exposure treatment. The exposure treatment may be discontinued just before the fluorine reaches onto the interface. In fact, the adhesiveness is increased by 30%.

The temperature of the sample determines a diffusion rate of the fluorine. Keeping the sample at a high temperature provides a gradual slope of the fluorine concentration profile due to a high diffusion rate of the fluorine. By contrast, keeping the sample at a high temperature provides a steep slope of the fluorine concentration profile. It is also possible to vary the temperature of the sample during the exposure treatment. In any event, according to the present invention, the temperature of the sample and the treatment time are so controlled that in the vicinity of the interface the fluorine concentration comes to or near to zero.

Figure 10:
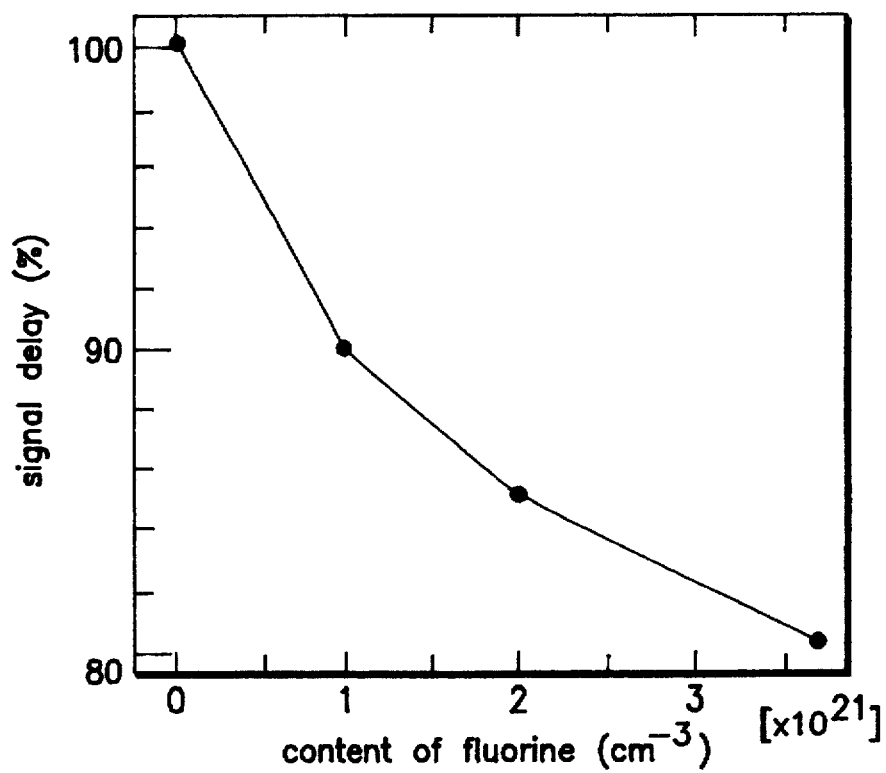
FIG. 10 is a diagram illustrative of a relationship of a degree of a signal delay with respect to interconnections versus a fluoro-concentration of a fluoro-containing polyimide prepared by a method of the present invention.

FIG. 10 is a diagram illustrative of a relationship of a degree of a signal delay with respect to interconnections versus the fluoro-concentration of the fluoro-containing polyimide prepared by the method described above. FIG. 10 indicates the fact that the degree of the signal delay is simply reduced as the content of the fluorine in the polyimide is increased.

Further, there were confirmed the facts that the use of F $SF_6$, $C_2F_4$, $NF_3$ and $C_2F_6$ have come into the same result as the above described result when using $CF_4$.

Furthermore, there was confirmed the fact that the same result as those described above is obtained even when in place of the plasma gas irradiation the fluorine based gases such as $CF_4$, $F_2$, $SF_6$, $C_2F_4$, $NF_3$ and $C_2F_6$ onto a tungsten heater to cause a dissociation of the fluorine based gases for the purpose of generating the fluorine radicals to be irradiated through the removal of any charge particles onto the surface of the polyimide.

Whereas modifications of the present invention will no doubt be apparent to a person having ordinary skill in the art, to which the invention pertains, it is to be understood that embodiments shown and described by way of illustrations are by no means intended to be considered in a limiting sense. Accordingly, it is to be intended to cover by claims all modifications of the present invention which fall within the spirit and scope of the present invention.

What is claimed is:

1. A method for forming a polyimide film containing fluorine on a base layer comprising the steps of:

forming a polyimide film free of fluorine on a base layer;

generating fluorine radicals in a fluorine based gas;

removing charge particles from said gas to leave said fluorine radicals in said gas; and exposing said polyimide film to an irradiation of said fluorine radicals so that said irradiated fluorine radicals penetrate into said polyimide, thereby avoiding reaction of the removed charge particles with a surface of said polyimide film.

2. The method as claimed in claim 1, wherein said fluorine based gas is selected from the group consisting of $CF_4$, $F_2$, $SF_6$, $C_2F_4$, $NF_3$ and $C_2F_6$.

3. The method as claimed in claim 1, wherein said removal of any charge particles from said gas is carried out by having said gas including said charge particles, said fluorine radicals and said neutral particles pass through a control grid applied with a predetermined voltage.

4. The method as claimed in claim 3, wherein said predetermined voltage is in the range from 100 to 300 V.

5. The method as claimed in claim 1, wherein said fluorine radicals are generated by a dissociation of said fluorine based gas where said dissociation is caused by irradiation of said fluorine based gas onto a tungsten heater in vacuum.

6. The method as claimed in claim 1, wherein said fluorine radicals are generated in a plasma gas by a glow discharge of said fluorine based gas in a vacuum.

7. The method as claimed in claim 1, wherein said base layer is a semiconductor layer.

8. The method as claimed in claim 1, wherein said base layer is an insulation layer.

9. The method as claimed in claim 1, wherein said base layer is a metal layer.

10. The method as claimed in claim 1, wherein a temperature of said polyimide film and a time for said irradiation are so controlled that a fluorine concentration of said polyimide film approaches zero or almost zero on an interface of said polyimide film with said base layer.

11. The method as claimed in claim 10, wherein said temperature is sufficiently high for facilitating a thermal diffusion of said fluorine radicals into a deep region of said polyimide.

12. The method as claimed in claim 11, wherein said temperature is set in-the range from 100° C. to 300° C.

13. The method as claimed in claim 1, wherein said polyimide free of fluorine is prepared by the steps of:

applying a polyamide acid on said base layer by a spin coating method; and subjecting said applied polyamide acid to a heat treatment to cause a thermal polymerization to thereby form a polyimide film free of fluorine.

* * * * *